US005460996A

United States Patent [19]
Ryou

[11] Patent Number: 5,460,996
[45] Date of Patent: Oct. 24, 1995

[54] METHOD FOR THE FABRICATION OF A STACKED CAPACITOR ALL IN THE DYNAMIC SEMICONDUCTOR MEMORY DEVICE

[75] Inventor: Eui K. Ryou, Kyoungki-do, Rep. of Korea

[73] Assignee: Hyundai Electronics Industries Co. Ltd., Kyoungki-do, Rep. of Korea

[21] Appl. No.: 301,623

[22] Filed: Sep. 7, 1994

[30] Foreign Application Priority Data

Sep. 9, 1993 [KR] Rep. of Korea ............... 93 18108

[51] Int. Cl.$^6$ ............................. H01L 21/70; H01L 27/00
[52] U.S. Cl. ........................ 437/52; 437/60; 437/919
[58] Field of Search .......................... 437/47, 52, 60, 437/919; 257/306

[56] References Cited

U.S. PATENT DOCUMENTS 5,330,614  7/1994  Ahn ............................ 156/631
5,389,560  2/1995  Park ............................ 437/52

OTHER PUBLICATIONS

Ser. No. 08/273,904 Eui Kyu Ryou Jul. 12, 1994.
Ser. No. 08/294,840 Keum et al. Aug. 29, 1994.
Ser. No. 08.297,759 Keum et al. Aug. 30, 1994.

*Primary Examiner*—Olik Chaudhuri
*Assistant Examiner*—H. Jey Tsai
*Attorney, Agent, or Firm*—Gary M. Nath

[57] ABSTRACT

A method for the fabrication of semiconductor memory device. The method comprises the processes of forming an MOS transistor having an impurity-diffused region of LDD structure at a semiconductor substrate having a P-well (or N-well) therein, forming a two-layer charge storage electrode in such a manner to come into contact with the impurity-diffused region of the MOS transistor, and sequentially forming a dielectric film and a plate electrode on all exposed areas of the two-layer charge storage electrode. The method forms a two-layer structure of charge storage electrode in a DRAM cell, effecting an increase of effective area in the charge storage electrode and improving the degree of integration in a semiconductor memory device.

4 Claims, 3 Drawing Sheets

METHOD FOR THE FABRICATION OF A STACKED CAPACITOR ALL IN THE DYNAMIC SEMICONDUCTOR MEMORY DEVICE

BACKGROUND OF THE INVENTION

1. Field of the Invention

The present invention relates, in general, to a method for fabricating a highly integrated semiconductor memory device and, more particularly, to a method for the fabrication of a semiconductor memory device, capable of securing a high charge storage capacity under the reduction of memory cell dimension.

2. Description of the Prior Art

An ordinary semiconductor memory device such as direct random access memory (hereafter referred to as "DRAM") has difficulty in securing a sufficient charge storage capacity as it is highly integrated. This is because the surface area of a storage electrode as well as the area occupied by a memory cell is largely reduced with the high integration of a semiconductor memory device. In fact, since a storage electrode 11 constituting a memory cell along with a field effect transistor, as shown in FIG. 1, is structured to have a flat board shape over the field effect transistor, its surface area is largely reduced with the reduction of the area occupied by a memory cell. Conventional memory cell fabrication methods also cannot increase the surface area of a storage electrode because the storage electrode is formed in the shape of a flat board thereby.

In order to better understand the background of the present invention, a description will now be given together with one of the conventional structure of a semiconductor memory device.

Referring to FIG. 1, a cross section of the semiconductor device is shown having a conventional semiconductor memory structure. As shown in FIG. 1, a semiconductor substrate 1 is sectioned by a field oxide film 2 into an isolation region and a device region over which a gate insulating film 3 and a word line is formed, followed by the formation of an oxide film spacer at a side wall of the word line 4. Using the word line and the spacer as a mask, dopants are implanted into the semiconductor substrate 1, to form a source/drain region 6, 6'. As a result, a transistor is fabricated. Thereafter, an insulating film 7 for planarization is coated over the entire surface of the transistor, which is then covered with a storage electrode 9 in such a way as to make the storage electrode 9 contact with the source or drain region. Finally, a dielectric film 18 is formed on the storage electrode 9, followed by the formation of a plate electrode 19 on the dielectric film 18.

As mentioned above, since the conventional semiconductor memory device has a flat board-type storage electrode, it cannot secure a sufficient charge storage capacity with the reduction of an area occupied by memory cell. The insufficient security of charge storage capacity incapacitates high integration in the conventional semiconductor memory device.

SUMMARY OF THE INVENTION

An objective of the present invention, therefore, is to overcome the above problems encountered in prior arts and to provide a method for the fabrication of a semiconductor memory device, capable of securing a sufficient charge storage capacity under reduction of an area occupied by memory cell.

In order to accomplish the above objective, a method is provided for the fabrication of a semiconductor memory device comprising the processes of forming an MOS transistor having an impurity-diffused region of LDD structure at a semiconductor substrate having a P-well (or N-well) therein, forming a two-layer charge storage electrode in such a manner so as to come into contact with the impurity-diffused region of the MOS transistor, and sequentially forming a dielectric film and a plate electrode on all exposed areas of the two-layer charge storage electrode.

BRIEF DESCRIPTION OF THE DRAWINGS

The above objective and other advantages of the present invention will become more apparent by describing in detail the preferred embodiment of the present invention with reference to the attached drawings in which.

DETAILED DESCRIPTION OF THE PREFERRED EMBODIMENT

Figure 1:
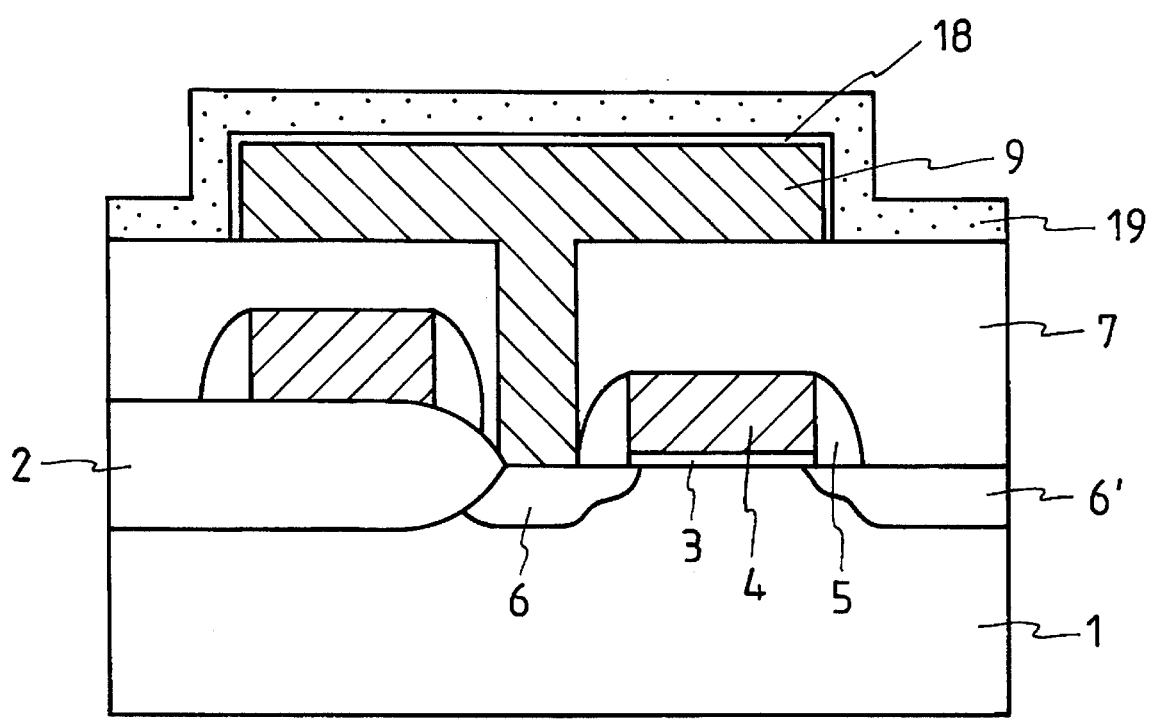
FIG. 1 is a schematic cross-sectional view of semiconductor device illustrating a conventional structure of semiconductor memory.

The application of the preferred embodiment of the present invention is best understood by referring to FIGS. 2A through 2D, wherein like reference numerals are used for like and corresponding parts of the drawings, respectively.

Figure 2A:
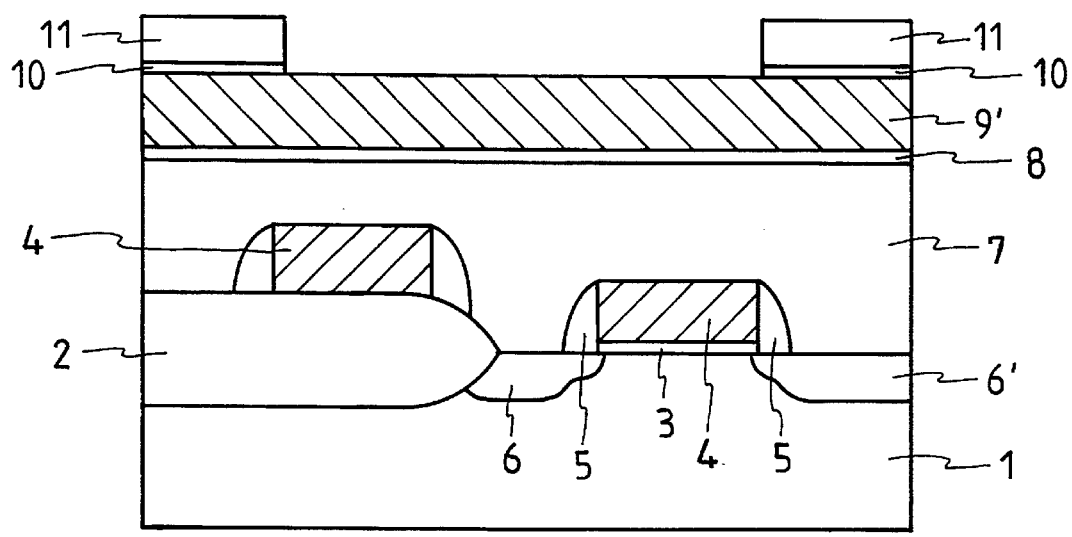
FIGS. 2A through 2D are schematic cross-sectional views of semiconductor device stepwise illustrating a method for fabricating a semiconductor memory device, according to the present invention.

First, referring to FIG. 2A, a cross section of semiconductor device is shown after an MOS transistor is planarized by an insulating oxide film over which a silicon nitride film and a charge storage electrode layer are sequentially formed with an oxide film pattern and a laminated silicon nitride film pattern.

The MOS transistor may be fabricated by an ordinary procedure. For example, to begin with, over a semiconductor substrate 1 having a P-well or N-well therein, a field oxide film 2 is grown by a local oxidation of silicon (LOCOS) process. A gate oxide film 3, a gate electrode and a word line pattern 4 are formed over a device region, a sectioned region of the semiconductor substrate 1 by the field oxide film 2. The formation of the gate electrode and the word line pattern 4 is carried out by depositing polysilicon on the gate oxide film 3, implanting impurities into this polysilicon and selectively etching the polysilicon implanted with the impurities by means of a mask. Thereafter, using the gate electrode and the word line pattern 4 as a mask, P (or N) type impurity ions are implanted at a relatively low density into the semiconductor substrate 1 and then, an oxide film spacer 5 is formed at a side wall provided by the gate electrode and word line pattern 4. Subsequently, another ion implantation is carried out with N (or P) type impurities of a relatively high density, using the oxide film spacer 5 as a mask. As a result of the two ion implantation processes, impurity-diffused regions 6, 6' of lightly doped drain (hereinafter referred to as "LDD") structure are constructed in the semiconductor substrate 1. Along with the gate electrode and the word line pattern 4, these impurity-diffused regions 6, 6' constitute an MOS transistor.

The planarization of the MOS transistor is accomplished by depositing an insulating oxide film over the MOS transistor in a predetermined thickness and etching the insulating oxide film entirely.

Over the insulating oxide film 7 planarized, a first silicon nitride film 8 is formed, followed by the formation of a first charge storage electrode layer 9' on the first silicon nitride film 8. The first silicon nitride film 8 serves as an etch stopper to prevent the insulating oxide film 7 from being etched, and the first charge storage electrode layer 9' is formed of polysilicon.

A first oxide film pattern 10 is laminated on the first charge storage electrode layer 9', followed by the lamination of a silicon nitride film pattern 11 on the first oxide film pattern 10. The lamination of the first oxide film pattern 10 and the silicon nitride film pattern 11 is performed by depositing an oxide film and a silicon nitride film sequentially over the first charge storage electrode layer 9' and selectively etching the barrier oxide film and the silicon nitride film by use of a mask of charge storage electrode and a mask with inverted pattern.

Figure 2B:
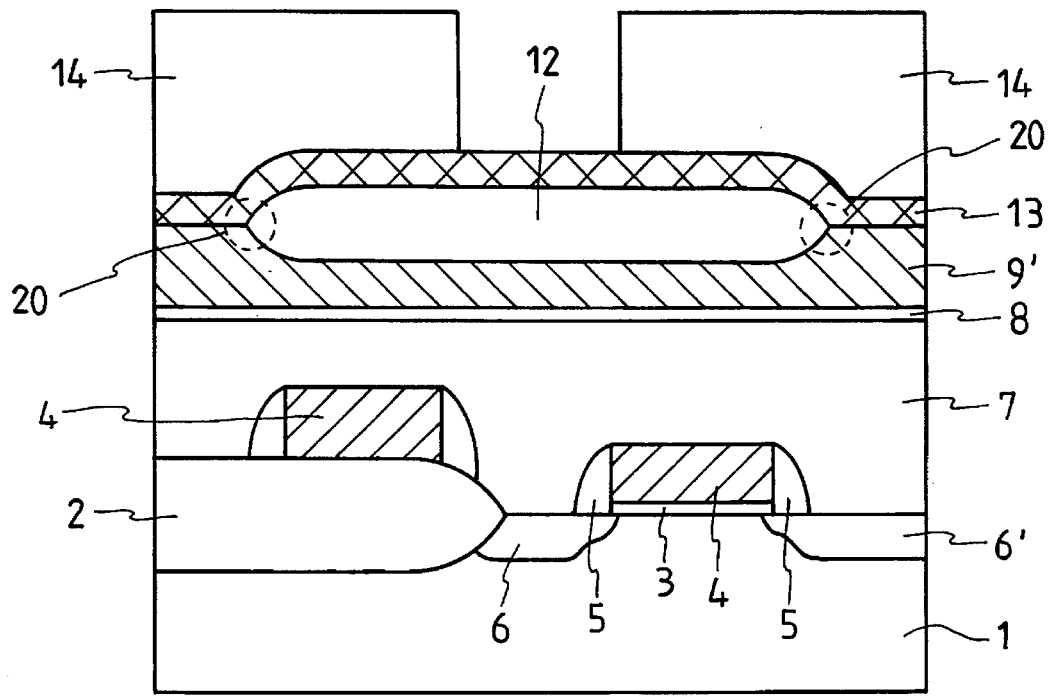

FIG. 2B shows a second oxide film pattern 12 with a predetermined thickness formed over the first storage electrode layer 9'. The second oxide film pattern 12 is formed by executing a hot oxidation process to deposit an oxide material over the area of the first charge storage electrode layer 9' exposed by the silicon nitride film pattern 11. At that moment, oxidation occurs along the grains of the first charge storage electrode 9', making the surface of the first charge storage electrode layer 9' rugged. After the formation of the second oxide film pattern 12, the silicon nitride film pattern 11 and the first oxide film pattern 10 are removed so as to expose the first charge storage electrode layer 9'. A second charge storage electrode 13 made of polysilicon is formed over the second oxide film pattern 12 and the exposed area of the first charge storage electrode layer 9'. Thereafter, a photosensitive film is coated on the second charge storage electrode 13 and is subjected to exposure and development by use of a mask for contact hole, so as to form a first photosensitive film pattern 14.

Figure 2C:
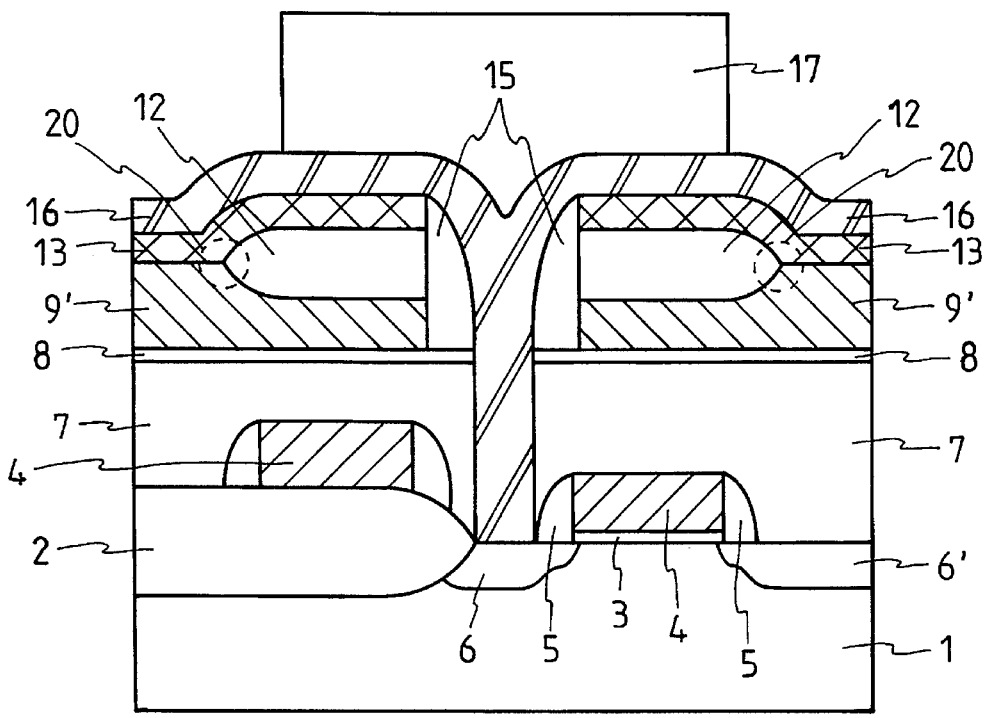

Using the first photosensitive film pattern 14 as a mask, an etch process is applied, to selectively etch the second charge storage electrode layer 13, the second oxide film pattern 12 and the first charge storage electrode layer 9, in due order. As a result, a contact hole is formed, exposing an area of the silicon nitride film 8 therethrough. After the formation of the contact hole, the first photosensitive film pattern 14 is removed. Subsequently, polysilicon is deposited in a predetermined thickness over an entire area of the second charge storage electrode layer 13 including the contact hole and then, subjected to anisotropic etch, to form a conductive spacer at a side wall of the contact hole, as shown in FIG. 2C. Thereafter, a selective etch process is undertaken to remove both the exposed area of the silicon nitride film 8 by the conductive spacer 15 and the insulating oxide film beneath the exposed area, thereby forming a second contact hole through which the impurity-diffused region 6 of the MOS transistor is exposed. Polysilicon is deposited in a predetermined thickness over an entire area of the second charge storage electrode layer 13 including the second contact hole, to form a third charge storage electrode 16. Then, on the third storage electrode layer 16, there is coated a photosensitive film which is subsequently subjected to exposure and development, so as to form a second photosensitive film pattern covering a predetermined area including the contact hole.

Figure 2D:
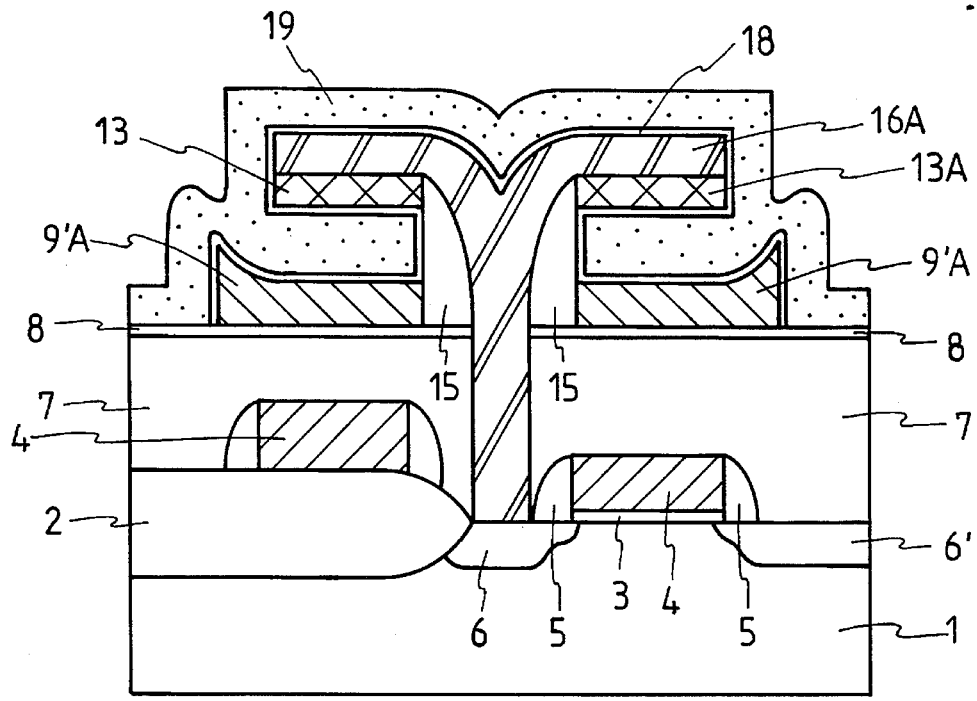

The third to the first charge storage electrode layers 16, 13, 9' are patterned by a selective etch process using the second photosensitive film pattern 17 and the second oxide film pattern 12 as a barrier, to form a two-layer structure of charge storage pattern, as shown in FIG. 2D. After the formation of the two-layer structure of charge storage pattern consisting of the first charge storage electrode 9'A, the second charge storage electrode 13A and the third charge storage electrode 16A, the second photosensitive film pattern 17 is removed, to expose the upper surface of the third charge storage electrode pattern 16A. Next, the second oxide film pattern 12 is subjected to wet etch, to expose the areas contacted with the second oxide film pattern 12, that is, the upper surface of the first charge storage electrode pattern 9A', the side surface of the conductive spacer and the lower surface of the second charge storage electrode pattern 13A. When the second oxide film pattern 12 is etched, the silicon nitride film 8 serves as an etch stopper to protect the insulating oxide film 7.

Over the exposed areas of the first to the third charge storage electrode patterns 9'A, 13A, 16A and the side surface of the conductive spacer 15, a dielectric film 18 is formed, followed by the formation of a plate electrode 19 over the dielectric film 18. The dielectric film 18 is formed by growing a dielectric material having a nitride-oxide (NO) or oxide-nitride-oxide (ONO) composite structure, or $Ta_2O_5$ on the exposed areas. The formation of the plate electrode 19 is carried out by depositing polysilicon doped with impurities over the dielectric film and patterning the polysilicon.

After completion of the above-mentioned processes, the first charge storage electrode pattern 9'A comes to have a larger area than the second and the third charge storage electrode patterns 13A, 16A, since an edge of the second oxide film pattern 12, a Bird's beak-shape portion 20, serves as a mask when the first charge storage electrode layer 9' becomes etched.

In accordance with an aspect of the present invention, when the second oxide film pattern 12 is subjected to wet etch to form the final charge storage electrode as shown in FIG. 2D, an effective area of charge storage electrode may be increased by etching a part of the silicon nitride film 8 beneath the first charge storage electrode pattern 9'A by use of etch selection ratio between insulating films without mask.

According to the method of the present invention, since the second oxide film pattern is deposited in such a way that there is generated oxidation along the grains of polysilicon of the first charge storage electrode, the upper portion of the first charge storage electrode pattern runs in and out along the shape of the grain by the wet etch process for the second oxide film pattern. In addition, due to the Bird's beak of the second oxide film pattern, a step is generated at an end of the first charge storage electrode pattern. Consequently, the first charge storage electrode pattern comes to have a more increased charge storage capacity, according to the present invention.

As described hereinbefore, the method of the present invention forms a two-layer structure of charge storage electrode in a DRAM cell, effecting an increase of effective area in the charge storage electrode and improving the degree of integration in a semiconductor memory device.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the fabrication of semiconductor memory device, comprising the steps of:

A. forming an MOS transistor having an impurity-diffused region of lightly doped drain structure over a semiconductor substrate;

B. forming a planarized insulating oxide film over the MOS transistor and sequentially laminating a silicon nitride film, a first charge storage electrode layer, a first oxide film pattern and a silicon nitride film pattern over the planarized insulating oxide film;

C. forming a second oxide film pattern over an area of the first charge storage electrode layer by use of an oxidation process with said area of the first charge storage electrode layer being exposed by both of said first oxide film pattern and said silicon nitride film pattern, selectively removing said first oxide film pattern and said silicon nitride film pattern, to expose said first charge storage electrode layer, forming a second charge storage electrode layer over said second oxide pattern and the exposed area of said first charge storage electrode layer, and forming a first photosensitive film pattern for a contact hole over said second charge storage electrode layer;

D. sequentially applying a selective etch to said second charge storage electrode layer, said second oxide film pattern and said first charge storage electrode layer to form a first contact hole exposing an area of said silicon nitride film, said first photosensitive film pattern serving as a mask, forming a conductive spacer at a side wall of said first contact hole, selectively etching said silicon nitride film and said planarized insulating oxide film to form a second contact hole exposing said impurity-diffused region with said conductive spacer serving as a mask, forming a third charge storage electrode over said second charge storage electrode layer to come into contact with said impurity-diffused region via said first contact hole and said second contact hole, and forming a second photosensitive film pattern over said third charge storage electrode layer;

E. selectively etching said third charge storage electrode layer, said second charge storage electrode layer and said first charge storage electrode layer, with both said second photosensitive film pattern and said second oxide film pattern serving as a mask, removing said second photosensitive film pattern and said second oxide film pattern, to expose all areas contacted therewith including surfaces of all said charge storage electrode patterns and the side surface of the conductive spacer, sequentially forming a dielectric film and a plate electrode layer over all of said exposed areas, and patterning said plate electrode layer.

2. A method for the fabrication of semiconductor memory device as in claim 1, wherein said second oxide film pattern has a shape of Bird's beak at its edge portion, whereby said first charge storage electrode pattern is allowed to have an acclivity at its end portion.

3. A method for the fabrication of semiconductor memory device as in claim 1, wherein said second oxide film pattern has a larger area than said second photosensitive film pattern, whereby said first charge storage electrode pattern is allowed to have a larger area than said second and third charge storage electrode patterns.

4. A method for the fabrication of semiconductor memory device, comprising the steps of:

A. forming an MOS transistor having an impurity-diffused region of lightly doped drain structure over a semiconductor substrate;

B. forming a planarized insulating oxide film over the MOS transistor and sequentially laminating a silicon nitride film, a first charge storage electrode layer, a first oxide film pattern and a silicon nitride film pattern over the planarized insulating oxide film;

C. forming a second oxide film pattern having a different etch selection ratio from said planarized insulating oxide film, over an area of said first charge storage electrode layer by use of an oxidation process with said area of the first charge storage electrode layer being exposed by both of said first oxide film pattern and said silicon nitride film pattern, selectively removing said first oxide film pattern and said silicon nitride film pattern, to expose said first charge storage electrode layer, forming a second charge storage electrode layer over said second oxide pattern and the exposed area of said first charge storage electrode layer, and forming a first photosensitive film pattern for a contact hole over said second charge storage electrode layer;

D. sequentially applying a selective etch to said second charge storage electrode layer, said second oxide film pattern and said first charge storage electrode layer to form a first contact hole exposing an area of said silicon nitride film, said first photosensitive film pattern serving as a mask, forming a conductive spacer at a side wall of said first contact hole, selectively etching said silicon nitride film and said planarized insulating oxide film to form a second contact hole exposing said impurity-diffused region, said conductive spacer serving as a mask, forming a third charge storage electrode over said second charge storage electrode layer to come into contact with said impurity-diffused region via said first contact hole and said second contact hole, and forming a second photosensitive film pattern over said third charge storage electrode layer;

E. selectively etching said third charge storage electrode layer, said second charge storage electrode layer and said first charge storage electrode layer with both said second photosensitive film pattern and said second oxide film pattern serving as a mask, removing said second photosensitive film pattern, said second oxide film pattern and said silicon nitride film, to expose the upper surface and lower surface of said first charge storage electrode layer, the lower surface of said second charge storage electrode layer, the upper surface of said third charge storage electrode layer and the side surface of said conductive spacer, sequentially forming a dielectric film and a plate electrode layer over all of said exposed surfaces and patterning said plate electrode layer.

* * * * *